(12) United States Patent
Kawakami (10) Patent No.: US 9,188,854 B2
(45) Date of Patent: Nov. 17, 2015

(54) TRANSFER APPARATUS AND METHOD OF MANUFACTURING DEVICE

(75) Inventor: Eigo Kawakami, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 30 days.

(21) Appl. No.: 13/230,417

(22) Filed: Sep. 12, 2011

(65) Prior Publication Data

US 2011/0316193 A1 Dec. 29, 2011

Related U.S. Application Data

(62) Division of application No. 12/476,552, filed on Jun. 2, 2009, now Pat. No. 8,226,392.

(30) Foreign Application Priority Data

Jun. 2, 2008 (JP) ................................. 2008-144011

(51) Int. Cl.
| | |
|---|---|
| *B29C 59/02* | (2006.01) |
| *G03F 7/00* | (2006.01) |
| *B29C 43/00* | (2006.01) |
| *B29C 43/02* | (2006.01) |
| *B29C 43/56* | (2006.01) |
| *B29C 43/58* | (2006.01) |
| *B82Y 10/00* | (2011.01) |
| *B82Y 40/00* | (2011.01) |

(52) U.S. Cl.
CPC ............ *G03F 7/0002* (2013.01); *B29C 43/003* (2013.01); *B29C 43/021* (2013.01); *B29C 43/56* (2013.01); *B29C 43/58* (2013.01); *B82Y 10/00* (2013.01); *B82Y 40/00* (2013.01); *B29C 2043/025* (2013.01); *B29C 2043/566* (2013.01); *B29C 2043/5825* (2013.01)

(58) Field of Classification Search
USPC .................................. 425/135, 174, 210, 255
See application file for complete search history.

(56) References Cited

U.S. PATENT DOCUMENTS

| | | | |
|---|---|---|---|
| 2001/0023010 A1* | 9/2001 | Yamada et al. ............... | 428/141 |
| 2003/0078153 A1* | 4/2003 | Wang et al. ..................... | 501/12 |
| 2006/0157444 A1* | 7/2006 | Nakamura et al. ............. | 216/54 |

FOREIGN PATENT DOCUMENTS

| | | | |
|---|---|---|---|
| JP | 2000159527 A | * | 6/2000 |
| JP | 2007-062168 A | | 3/2007 |
| JP | 2007098779 A | * | 4/2007 |
| JP | 2008-012672 A | | 1/2008 |

OTHER PUBLICATIONS

Sakata, JP 2007-098779 A Machine Translation, Apr. 2007.*

* cited by examiner

*Primary Examiner* — Ryan Ochylski
(74) *Attorney, Agent, or Firm* — Canon USA, Inc., IP Division (57) ABSTRACT

A transfer apparatus, for molding a resin on a substrate using a mold on which a pattern is formed and releasing the mold from the resin to transfer the pattern onto the substrate, includes a charge removing device configured to remove a charge of the mold, and a detector configured to detect an electric potential of the mold. The charge removing device is configured to remove the charge of the mold if the electric potential of the mold detected by the detector is not less than a predetermined value.

5 Claims, 10 Drawing Sheets

TRANSFER APPARATUS AND METHOD OF MANUFACTURING DEVICE

CROSS-REFERENCE TO RELATED APPLICATIONS

This application is a divisional application of U.S. patent application Ser. No. 12/476,552 filed Jun. 2, 2009, which claims priority to Japanese Patent Application No. 2008-144011, filed on Jun. 2, 2008. Each of U.S. patent application Ser. No. 12/476,552 and Japanese Patent Application No. 2008-144011 is hereby incorporated by reference herein in its entirety.

BACKGROUND OF THE INVENTION

1. Field of the Invention

The present invention relates to a transfer apparatus which transfers a pattern of a mold onto a substrate.

2. Description of the Related Art

As a technology replaced from a method for forming a fine pattern onto a semiconductor device using lithography by an ultraviolet ray, an X-ray, or an electron beam, a nanoimprint has been known. The nanoimprint is a technology for transferring a pattern onto a substrate by pressing (imprinting) a mold on which a fine pattern is formed to a substrate such as a wafer coated with a resin (a resist).

There are several kinds of nanoimprint. As one of the methods, conventionally, a photo-curing method has been proposed. The photo-curing method detaches the mold from the resin after exposing and curing the resin in a state where a transmissive mold is pressed to an ultraviolet ray curing type resin. In this case, for example, a silica grass which transmits the ultraviolet ray is used as a mold.

However, when releasing the mold from the resin, the phenomena of detachment charge occur. This is caused by generating a plus static electricity in a mold and a minus static electricity in a resin. When the material of the mold is a dielectric material such as a silica glass through which the ultraviolet ray transmits, the generated static electricity does not disappear once charged and the charged state is maintained. Thus, when the static electricity caused by the detachment charge is generated to charge the mold, dusts around the air is drawn to adhere to the mold. Therefore, in transferring the next shot, the press to the resin is performed in a state where the dusts adhere to the mold. Thus, there is a problem that the dusts are also transferred onto the wafer or a fine pattern of the mold is destroyed at the time of the transfer.

In this respect, Japanese Patent Laid-Open No. 2007-98779 discloses a technology for removing the static electricity generated in a mold by introducing ionized gas between a resin and a mold every time after releasing the resin from the mold.

However, when the ionized gas is introduced between the resin and the mold every time, it takes extra time to remove the static electricity and the reduction of throughput in a transfer apparatus is caused.

BRIEF SUMMARY OF THE INVENTION

The present invention provides a transfer apparatus which has an advantage in throughput. The present invention also provides a method of manufacturing a device using such a transfer apparatus.

A transfer apparatus as one aspect of the present invention is a transfer apparatus for molding a resin on a substrate using a mold on which a pattern is formed and releasing the mold from the resin to transfer the pattern onto the substrate. The apparatus includes a charge removing device configured to remove a charge of the mold, and a detector configured to detect an electric potential of the mold. The charge removing device is configured to remove the charge of the mold if the electric potential detected by the detector is greater than a predetermined value.

A transfer apparatus as another aspect of the present invention is a transfer apparatus for molding a resin on a substrate using a mold on which a pattern is formed and releasing the mold from the resin to transfer the pattern onto the substrate. The apparatus includes a mold chuck configured to hold the mold; and a charge removing device configured to remove a charge of the mold. The charge removing device is configured to remove the charge of the mold at a charge removing region arranged on a conveying path of the mold from the mold chuck.

A transfer apparatus as another aspect of the present invention is a transfer apparatus for molding a resin on a substrate using a mold on which a pattern is formed and releasing the mold from the resin to transfer the pattern onto the substrate. The apparatus includes a substrate chuck configured to hold the substrate, and a charge removing device configured to remove a charge of the substrate. The charge removing device is configured to remove the charge of the substrate at a charge removing region arranged on a conveying path of the substrate from the substrate chuck.

A method of manufacturing a device as another aspect of the present invention includes the steps of transferring a pattern to a substrate using the above transfer apparatus, and processing the substrate to which the pattern has been transferred to manufacture the device.

Further features and aspects of the present invention will become apparent from the following description of exemplary embodiments with reference to the attached drawings.

For example, a transfer apparatus as another aspect of the present invention is a transfer apparatus for molding a resin on a substrate using a mold on which a pattern is formed and releasing the mold from the resin to transfer the pattern onto the substrate. The apparatus includes a stage configured to hold the substrate and to be moved, and a charge removing device arranged on the stage and configured to remove a charge of the mold. The apparatus is configured to move the stage and remove the charge of the mold by the charge removing device in parallel.

DETAILED DESCRIPTION OF THE PREFERRED EMBODIMENTS

Exemplary embodiments of the present invention will be described below with reference to the accompanied drawings. In each of the drawings, the same elements will be denoted by the same reference numerals and the duplicate descriptions thereof will be omitted. The present embodiment relates to a transfer apparatus of a photo-curing type nanoimprint, and more particularly to a transfer apparatus which is usable for a microfabrication apparatus manufacturing a semiconductor, a MEMS (Micro Electro-Mechanical System), or the like.

A transfer apparatus of the present embodiment is a transfer apparatus which transfers a pattern onto a substrate by pressing a mold on which the pattern is formed to a resin provided on the substrate and by releasing the mold from the resin. The transfer apparatus of the present embodiment is configured to press the mold to the substrate, but is not limited to this. A configuration where the relative distance between the mold and the substrate can be close, for example a configuration where the substrate is pressed to the mold, can be adopted.

Embodiment 1

Figure 1:
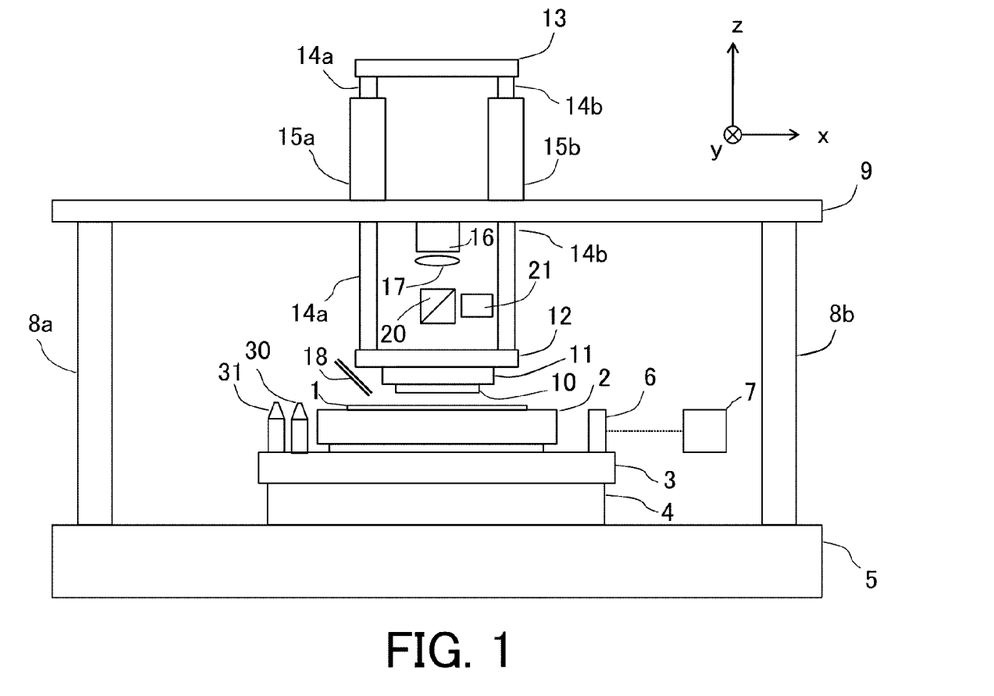
FIG. 1 is a configuration diagram of a transfer apparatus in the embodiment of the present invention.

First, embodiment 1 of the present invention will be described. FIG. 1 is a configuration diagram of a transfer apparatus that is the embodiment of the present invention.

In FIG. 1, reference numeral 1 denotes a wafer (a substrate), and reference numeral 2 denotes a wafer chuck for holding the wafer 1. Reference numeral 3 denotes a fine motion stage that has a correcting function of a position of the wafer 1 in a θ direction (a rotating direction around z-axis), an adjusting function of a z position of the wafer 1, and a tilt function for correcting the tilt of the wafer 1. The fine motion stage 3 is provided on an XY stage 4 for positioning the wafer 1 at a predetermined position. The fine motion stage 3 and the XY stage 4 move while holding the wafer 1.

Reference numeral 5 denotes a base platen on which the XY stage is placed. Reference numeral 6 denotes a reference mirror which is mounted on the fine motion stage 3 in x and y directions (a reference mirror of y direction is not shown) and reflects light from a laser interferometer 7 to measure a position of the fine motion stage 3. Reference numerals 8a and 8b denote braces which stand on the base platen 5 to support a top board 9.

Reference numeral 10 denotes a mold on which a pattern to be transferred onto the wafer 1 is formed. Reference numeral 11 denotes a mold chuck which is placed on a mold chuck stage 12 after the mold 10 is installed. The mold chuck stage 12 has a correcting function of a position of the mold 10 (the mold chuck 11) in a θ direction (a rotating direction around z-axis) and a tilt function for correcting the tilt of the mold 10.

Reference numeral 13 denotes a guide bar plate. One ends of guide bars 14a and 14b are fixed on the mold chuck stage 12. The guide bar plate 13 fixes the other ends of the guide bars 14a and 14b which pass through the top plate 9. Reference numerals 15a and 15b are linear actuators including an air cylinder or a linear motor. The linear actuators 15a and 15b drive the guide bars 14a and 14b in a z direction in FIG. 1 (an upper direction) so that the mold 10 held on the mold chuck 11 can be pressed to or released from the wafer 1.

Reference numeral 16 denotes a UV light source which irradiates UV light for exposing a photo-curing type resin through a collimator lens 17. Reference numeral 18 denotes a resin dropping nozzle which drops a liquid resin on a surface of the wafer 1. Reference numeral 20 denotes a beam splitter which is placed in an optical path of the UV light source 16. The beam splitter 20 is used for observing the pressing status of the mold 10 by an image pickup system 21. Each of the mold chuck 11 and the mold chuck stage 12 has an opening (not shown) which passes the light irradiated from the UV light source 16 to the mold 10.

Reference numerals 30 and 31 denote nozzles of an ionizer. The nozzles 30 and 31 of the ionizer are used as a charge removing device which removes the charge of the mold 10. The nozzles 30 and 31 of the ionizer blow or absorb (recover) ionized gas. The nozzles 30 and 31 of the ionizer are provided on the fine motion stage 3.

Figure 3:
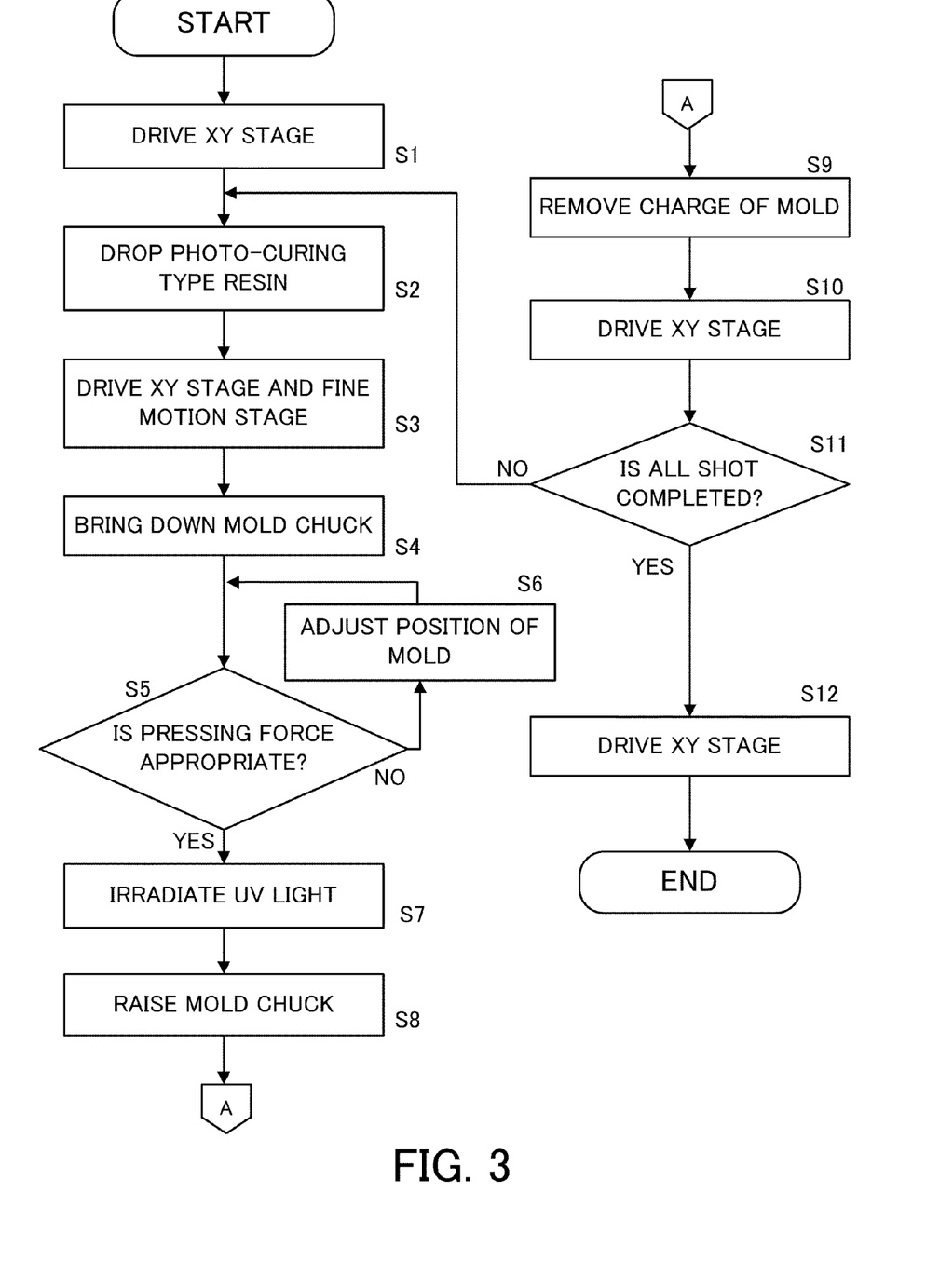
FIG. 3 is a flowchart of a pattern transfer process by a transfer apparatus of embodiment 1.

Next, a pattern transfer motion of the transfer apparatus which is configured as described above will be described. FIG. 3 is a flowchart of a pattern transfer process by the transfer apparatus of the present embodiment.

First, the XY stage 4 of the transfer apparatus is driven so as to move the wafer chuck 2 on which the wafer 1 is placed and to position the place (shot) on the wafer 1 where a pattern transfer is performed under the resin dropping nozzle 18 (Step S1). Then, a predetermined amount of a photo-curing type resin (a resist) is dropped on the wafer 1 (Step S2).

Next, the XY stage 4 is driven to move the wafer chuck 2 again so that the shot is placed at a position opposed to the mold 10. Then, the height and the tilt of the wafer chuck 2 in a z direction is adjusted by the fine motion stage 3 to align a surface of the shot of the wafer 1 on a reference plane surface (not shown) of the apparatus (Step S3).

Subsequently, the linear actuators 15a and 15b are driven to bring down the mold chuck stage 12 and to press the mold 10 to a resin dropped on the wafer 1 (Step S4). A plurality of load cells (not shown) are mounted on the mold chuck 11 or the mold chuck stage 12. The mold chuck stage 12 changes the tilt of the mold chuck 11 in accordance with an output of the plurality of load cells so that the pressing force of the mold 10 to the resin can be controlled to a predetermined value. The pressing force of the mold 10 is adjusted by changing an amount of the pressing force by the linear actuators 15a and 15b (Steps S5 and S6).

After adjusting the pressing force of the mold 10, the irradiation of the UV light is performed by the UV light source 16 (Step S7). When completing the irradiation of the UV light in a predetermined time, the linear actuators 15a and 15b are driven to bring up the mold chuck stage 12 to release the mold 10 from the wafer 1 (Step S8).

Figure 2A:
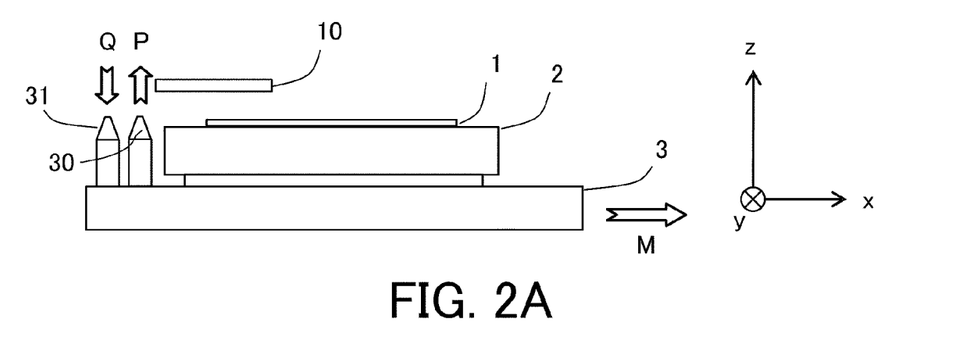
FIGS. 2A and 2B are cross-sectional views of a main part including a charge removing device in a transfer apparatus of embodiment 1.
Figure 2B:
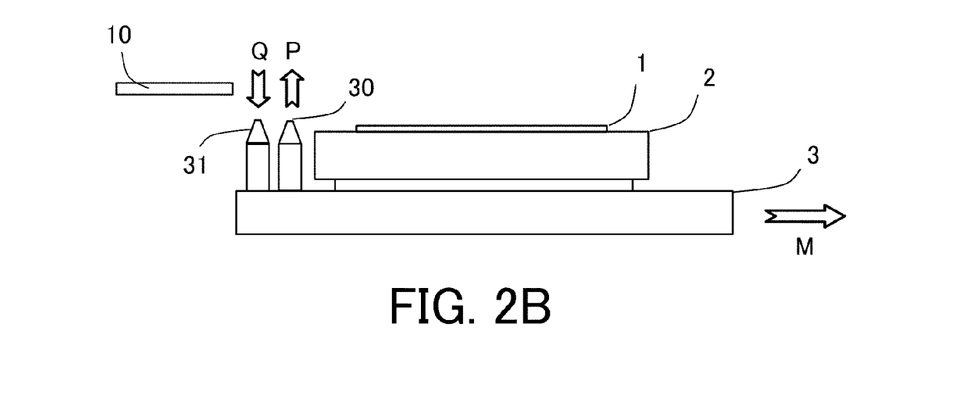

Subsequently, a charge removal of the mold 10 is performed (Step S9). Here, the charge removal of the mold 10 will be described. FIGS. 2A and 2B are cross-sectional views of a main part including a charge removing device in the transfer apparatus of the present embodiment. As shown in FIGS. 2A and 2B, the nozzles 30 and 31 of the ionizer is provided on the fine motion stage 3.

When completing releasing the mold at Step S8 in FIG. 3, at Step S9, as shown in FIG. 2A, the XY stage 4 (the fine motion stage 3) is driven so that the nozzle 30 of the ionizer is positioned at one end of a pattern surface of the mold 10. Next, the ionized gas is blown to one end of the mold 10 (a direction indicated by an arrow P) from the nozzle 30 of the ionizer. While blowing the ionized gas to the mold 10, the XY stage 4 is driven in a direction indicated by an arrow M to perform a charge removing process for the pattern surface of the mold 10. The XY stage 4 is driven in the direction indicated by the arrow M to change the position relation of FIG. 2A between the mold 10 and the nozzles 30 and 31 of the ionizer provided on the fine motion stage 3 as shown in FIG. 2B. FIG. 2B shows a state where the charge removing process for the mold 10 using the ionized gas is completed.

The nozzle 31 of the ionizer suctions to recover the ionized gas which is blown from the nozzle 30 of the ionizer and returns by hitting the mold 10 (a direction indicated by an arrow Q). If there are dusts which have been blown away by the ionized gas blown from the nozzle 30 of the ionizer, the nozzle 31 of the ionizer recovers the dusts in addition to preventing the dusts from dispersing circumferentially.

Thus, each of the nozzles 30 and 31 of the ionizer as a charge removing device has functions as a blowing device which blows the ionized gas and a recovery device which recovers the ionized gas.

The motion of the blow and recovery of the ionized gas can be performed by each of the nozzles 30 and 31 of the ionizer. In the mold charge removing process at Step S9, the motion of the blow or the recovery of the ionized gas can be selected so that the driving amount of the XY stage 4 is at a minimum.

The nozzles 30 and 31 of the ionizer remove the charge while the fine motion stage 3 and the XY stage 4 moves. The drive velocity of the XY stage 4 at the time of performing the charge removing process can be changed in accordance with the combination of the material of the mold 10 and the resin. For example, when the mold and the resin are far from each other in the triboelectric series table, the amount of charges also increases. In this case, the drive velocity of the XY stage 4 is slow down. On the other hand, when these are the combination of a mold and a resin similar to each other in the triboelectric series table, the amount of charges is small. In this case, the drive velocity of the XY stage 4 is controlled to be a little bit faster.

The gas blown from the nozzles 30 and 31 of the ionizer is not limited to the ionized gas. For example, the charge removing effect similar to that of the case of the ionized gas can be obtained also by blowing gas which has humidity higher than that of the circumference of the mold 10.

When the charge removal of the mold 10 is completed, the XY stage 4 is driven to move the wafer chuck 2 in order to drop a resin for the subsequent shot (Step S10). A series of the processes are repeated until the pattern transfer for all shots on the wafer 1 is completed (Step S11). When completing the pattern transfer for all shots, the XY stage 4 is driven to move the wafer 1 at a predetermined position (Step S12), and the pattern transfer for one wafer is completed.

As described above, a detachment charge state of the mold generated at the time of releasing the mold can be eliminated by moving the ionizer to remove the charge in an overall mold every shot of the pattern transfer process. Therefore, the adhesion of dusts to the mold can be prevented before performing the transfer process for the next shot.

Embodiment 2

Next, embodiment 2 of the present invention will be described. FIGS. 4A to 4E are motion transition diagrams of a pattern transfer process by a transfer apparatus of the present embodiment. FIGS. 4A to 4E show only a main part including a charge removing device.

Figure 4A:
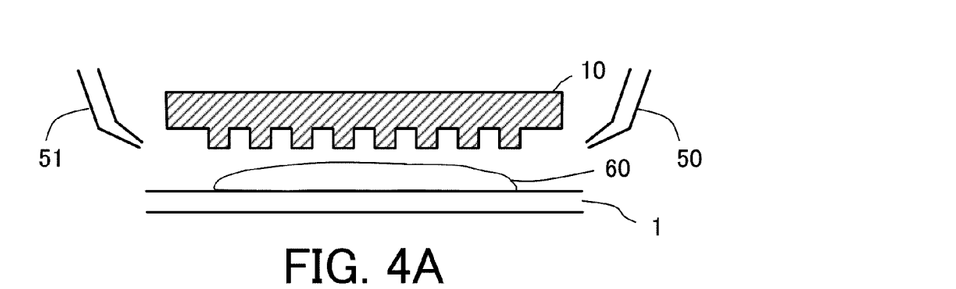
FIGS. 4A to 4E are motion transition diagrams of a pattern transfer process by a transfer apparatus of embodiment 2.
Figure 4B:
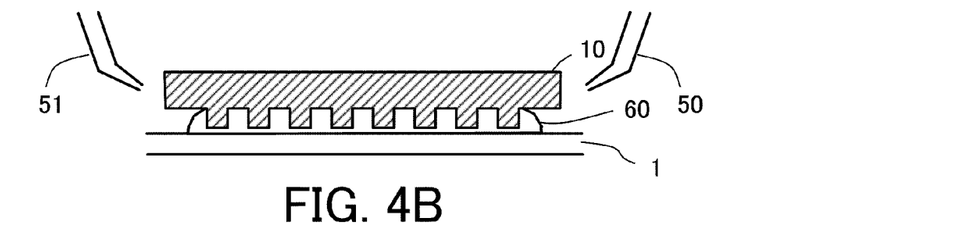
Figure 4C:
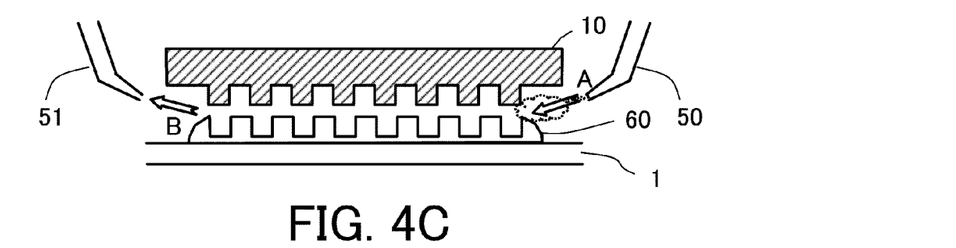

In FIGS. 4A to 4E, reference numeral 1 denotes a wafer, reference numeral 60 denotes a resin (a photo-curing type resin), reference numeral 10 denotes a mold, and reference numerals 50 and 51 are nozzles of an ionizer. The nozzles 50 and 51 of the ionizer are, for example, fixed on a top plate 9 in FIG. 1 and a plurality of the nozzles are provided around the mold. These nozzles move independently from the motion according to the transfer process of the mold 10 and the height from the wafer 1 does not change. The flowchart of the transfer process is the same as that of FIG. 3. First, in FIG. 4A, the wafer 1 moves at a position where a concave-convex pattern surface of the mold 10 is opposed to the resin 60 dropped on the wafer 1 (Step S3 in FIG. 3). Next, the mold 10 goes down as shown in FIG. 4B to press the resin 60, and the ultraviolet ray from the UV light source 16 of FIG. 1 is irradiated on the resin 60 through the mold 10 (Steps S4 to S7 in FIG. 3). Subsequently, at Step S8 in FIG. 3, the mold 10 goes up to be released from the resin 60. In performing the charge removal of the mold at the subsequent Step S9 in FIG. 3, as shown in FIG. 4C, the ionized gas is blown from the nozzle 50 of the ionizer (an arrow A), and the suction and the recovery of the blown gas is performed by the nozzle 51 of the ionizer (an arrow B). Thus, the ionized gas rapidly passes through a gap between the mold 10 and the resin 60 to remove the charges of both the mold 10 and the resin 60. In this case, the nozzles 50 and 51 of the ionizer are able to perform both motions of blowing and recovering the ionized gas as in the case of embodiment 1.

The time of blowing or recovering the ionized gas by the nozzles 50 and 51 of the ionizer, i.e. charge removing process time, may be changed in accordance with the combination of the material of the mold 10 and the resin 60. For example, when the mold 10 and the resin 60 are far from each other in the triboelectric series table, the charge removing process time is set to a time longer than usual because an amount of charges also increases. On the other hand, in the case of the combination of the mold and the resin which are close to each other in the triboelectric series table, the charge removing process time is set to a time shorter than usual because the amount of charges is small. The transfer apparatus has a table which defines a relationship between the combination of the material of the mold 10 and the resin 60 and the charge removing process time. This table is in advance held in a storage device which is provided in or out of the transfer apparatus.

The gas blown from the nozzles 50 and 51 of the ionizer is not limited to the ionized gas, but other gases by which the charge removing effect is obtained can also be used. For example, the charge removing effect can be obtained also by blowing gas which has humidity higher than that of the circumference of the mold 10.

As described above, when a plurality of pairs of the nozzles 50 and 51 of the ionizer (for example, two to four pairs) are provided around the mold 10, the drive of the XY stage 4 for removing the charge in a time of the charge removal of the mold 10 is not necessary.

Figure 5:
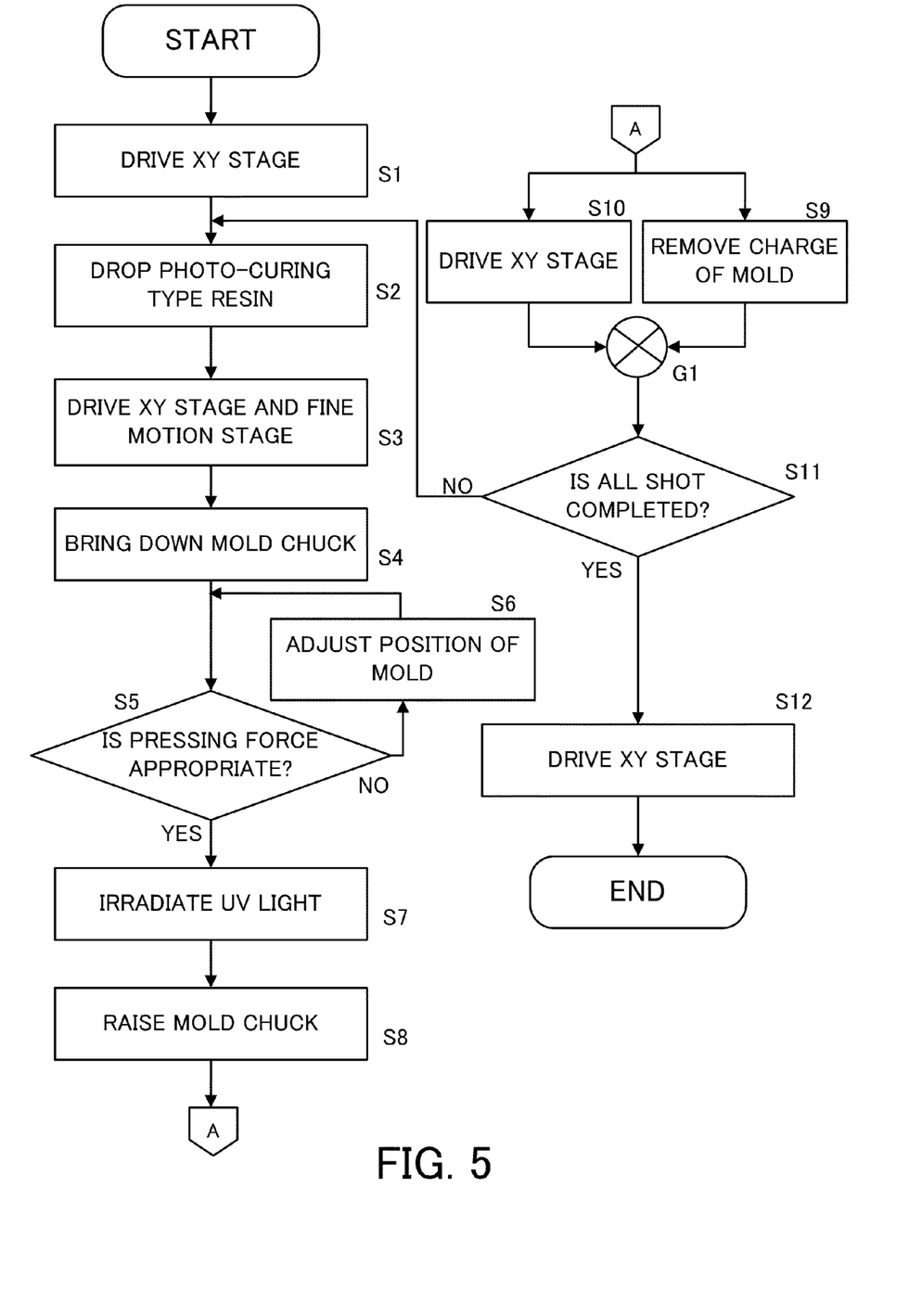
FIG. 5 is a flowchart of a pattern transfer process by a transfer apparatus of embodiment 2.

Next, the pattern transfer process by the transfer apparatus of the present embodiment will be described. FIG. 5 is a flowchart of the transfer process of the present embodiment. The flowchart of FIG. 5 differs in the timing of Steps S9 and S10 compared to the flowchart of FIG. 3, and on the other hand, the other flows are the same as those of FIG. 3.

As shown in FIG. 5, in the transfer process of the present embodiment, the charge removal of the mold 10 (Step S9) and the drive of the XY stage 4 for the next shot (Step S10) are performed in parallel. In other words, the charge removal of the mold 10 by the charge removing device is performed while moving the wafer 1 with respect to the mold 10. When both Steps S9 and S10 are performed, the flow proceeds to Step S11 via a gate G1. Therefore, the reduction of the throughput caused by removing the charge of the mold 10 can be further suppressed.

Figure 4D:
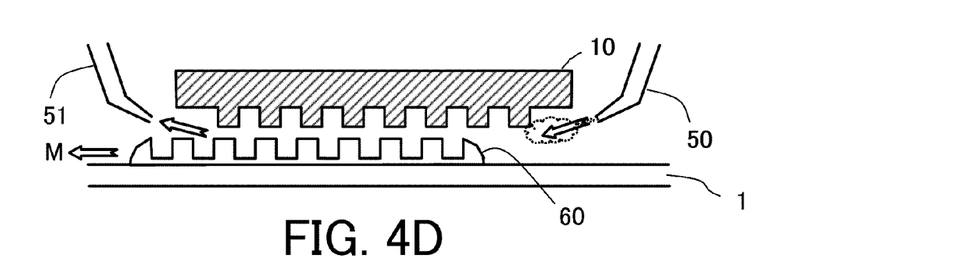

In the embodiment, the motion of the blow or the recovery of the ionized gas by the nozzles 50 and 51 of the ionizer can be selected in accordance with a drive direction of the XY stage 4. As shown in FIG. 4D, the nozzle 51 of the ionizer that is provided in a drive direction (a direction indicated by an arrow M) of the XY stage 4 (the wafer 1 and the resin 60) suctions and recovers the ionized gas. On the other hand, the nozzle 50 which is provided in a direction opposite to the drive direction of the XY stage 4 blows the ionized gas. Such a configuration enables the ionized gas to easily flow along a pattern surface of the mold 10 in conjunction with the motion of the XY stage 4 to be able to more easily remove the charge of the mold 10.

Figure 4E:
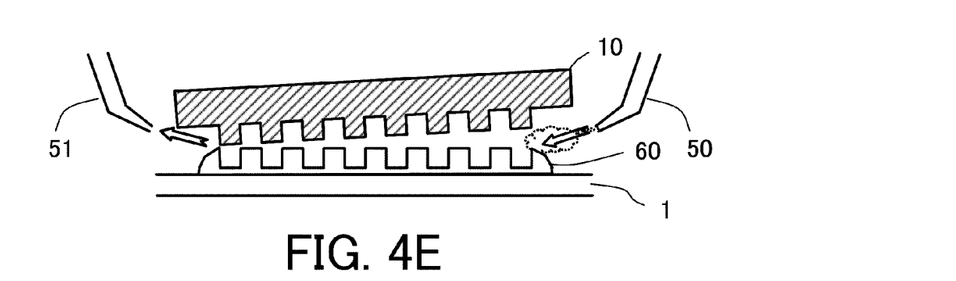

In the present embodiment, as shown in FIG. 4E, when the mold 10 is released in a state where the attitude of the mold 10 is tilted with respect to a plane surface of the wafer 1, the ionized gas is blown from the nozzle 50 which is provided in a direction where the release of the mold has started (mold release starting point). Such a configuration enables the ionized gas to easily flow along the pattern surface of the mold 10 to more easily remove the charge of the mold.

Embodiment 3

Figure 6A:
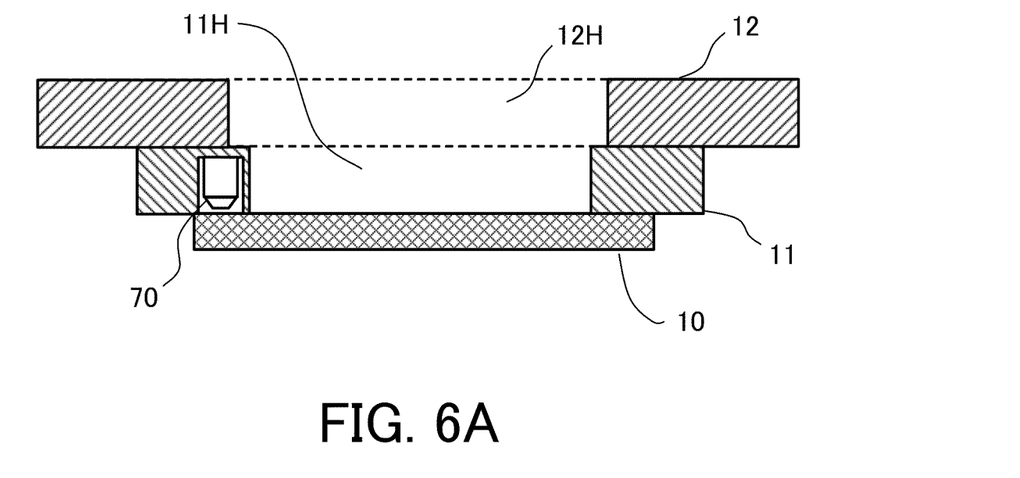
FIGS. 6A and 6B are cross-sectional views of a main part including a charge detecting device in a transfer apparatus of embodiment 3.
Figure 6B:
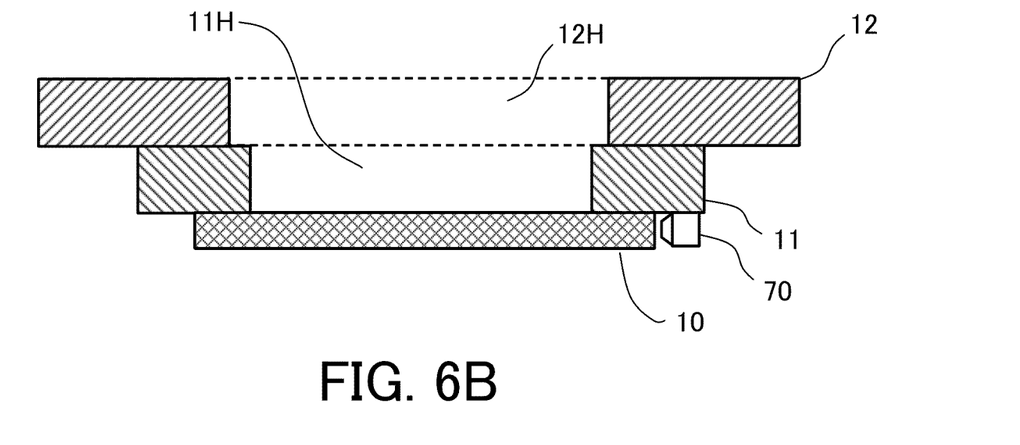

Next, embodiment 3 of the present invention will be described. FIGS. 6A and 6B are cross-sectional views of a main part including a charge detecting device in a transfer apparatus of the present embodiment. FIGS. 6A and 6B show configuration examples differing from each other.

In FIGS. 6A and 6B, reference numeral 10 denotes a mold, reference numeral 11 denotes a mold chuck, and reference numeral 12 denotes a mold chuck stage. Reference numeral 11H denotes an opening which is provided in the mold chuck 11 in order to pass the irradiated light from the UV light source to the mold 10. Similarly, reference numeral 12H denotes an opening which is provided in the mold chuck stage 12 in order to pass the irradiated light from the UV light source to the mold 10.

Reference numeral 70 denotes a surface electric potential sensor which detects the charged state of the mold 10. The surface electric potential sensor is used as a detector for detecting the electric potential of the mold 10. It is not limited to the thing that detects the electric potential of the mold surface, but a charged state detecting unit which is capable of detecting the charged state of the mold 10 may be used.

In the example of FIG. 6A, the surface electric potential sensor 70 is embedded in the mold chuck 11. The surface electric potential sensor 70 shown in FIG. 6A detects the surface electric potential of a surface at a side opposite to the surface on which a pattern of the mold 10 is formed. On the other hand, in the example of FIG. 6B, the surface electric potential sensor 70 is provided on the surface of the mold chuck 11 on which the mold 10 is mounted. The surface electric potential sensor 70 shown in FIG. 6B detects the surface electric potential at a side surface of the mold 10. In any of the examples, the charge amount of the mold 10 can be detected as a surface electric potential of the mold 10. The surface electric potential of the mold 10 detected by the surface electric potential sensor 70 is used for determining the charge removing process time which is needed to remove the charge.

Figure 7:
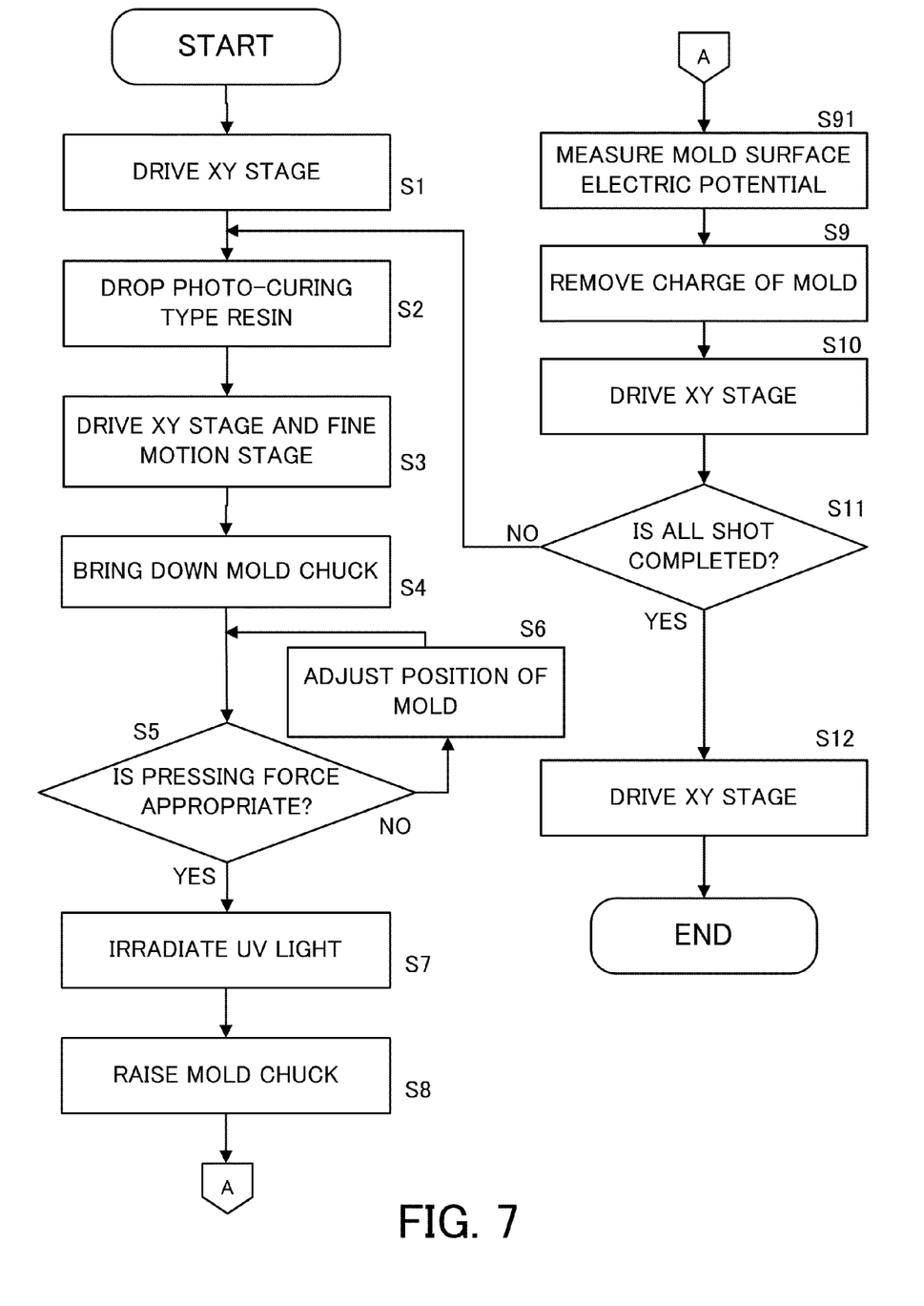
FIG. 7 is a flowchart of a pattern transfer process by a transfer apparatus of embodiment 3.

Next, a pattern transfer process by the transfer apparatus of the present embodiment will be described. FIG. 7 is a flowchart of the pattern transfer process of the present embodiment. The flowchart of FIG. 7 is different from that of FIG. 3 in that Step S91 is provided between Steps S8 and S9, the other portions are the same as those of FIG. 3.

When the release of the mold 10 is completed and the mold chuck 11 goes up (Step S8), the surface electric potential of the mold 10 is measured by the surface electric potential sensor 70 (Step S91). Subsequently, at Step S9, the charge removal of the mold 10 is performed by the method described in embodiment 1 or 2 during the time depending on the value of the surface electric potential of the mold 10 detected at Step S91. Thus, in the present embodiment, because the charge removing time can be changed in accordance with the surface electric potential of the mold 10, the reduction of the throughput can be suppressed.

Figure 8:
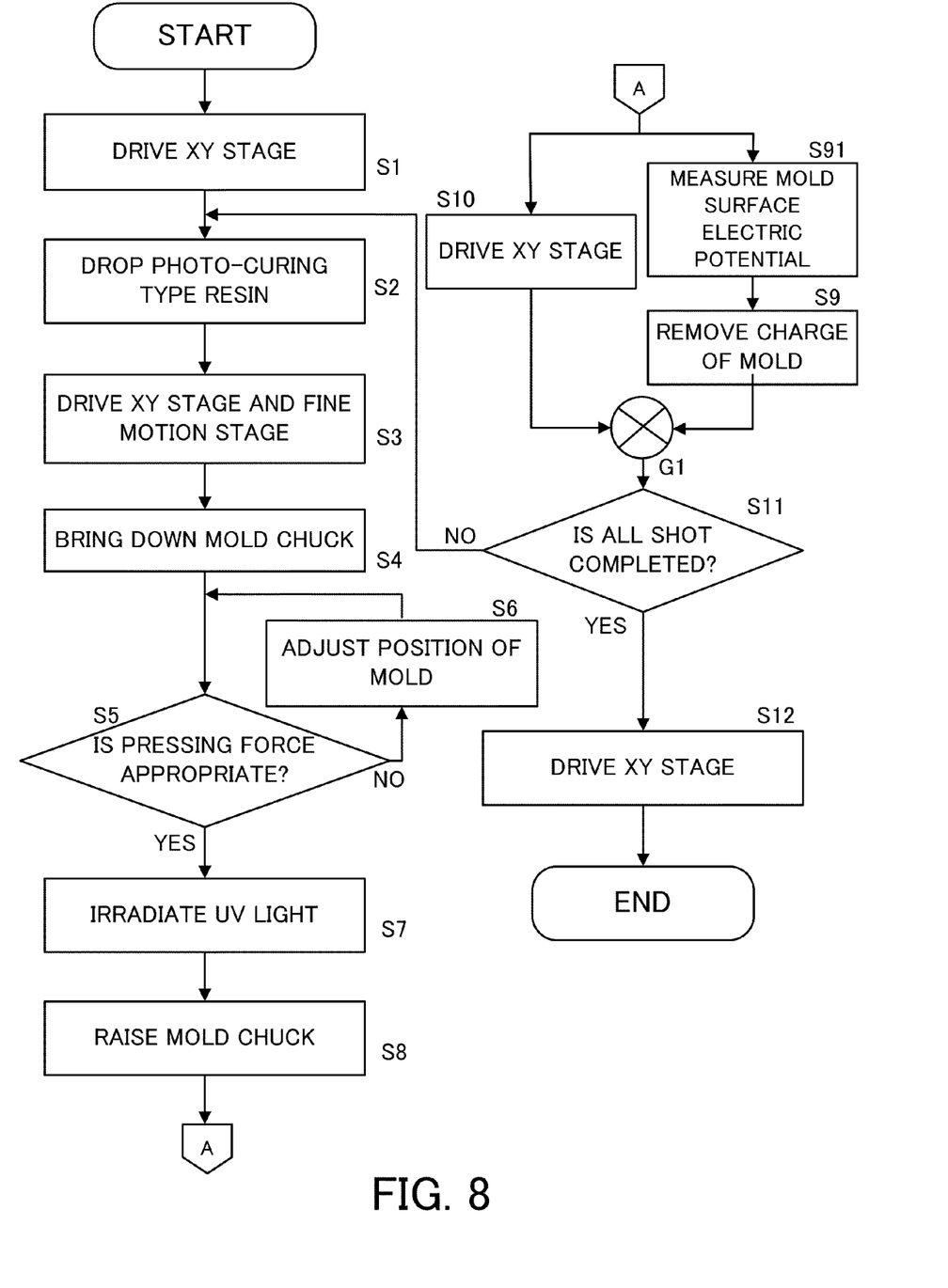
FIG. 8 is a flowchart of a pattern transfer process that is another example in embodiment 3.

FIG. 8 is a flowchart of the pattern transfer process that is another example in the present embodiment. The example is different from the example shown in FIG. 7 in that the surface electric potential measurement of the mold (Step S91) and the subsequent charge removal of the mold (Step S9) are performed in parallel to the XY stage drive (Step S10) to the resin dropping position of the next shot. When both Steps S9 and S10 are completed, the flow proceeds to Step S11 via the gate G1. The charge removal of the mold at Step S9 is performed by the method described in embodiment 2. Thus, according to the example, the reduction of the throughput can be further suppressed.

As described above, because the charge removing process time to remove the charge is adjusted in accordance with the charge amount of the mold (the surface electric potential), the reduction of the throughput can be suppressed compared to the case where the charge removing process is performed at a constant fixed time. In addition, because the charge removing process is performed in parallel to the drive of the XY stage, the reduction of the throughput can be further suppressed.

Embodiment 4

Figure 9:
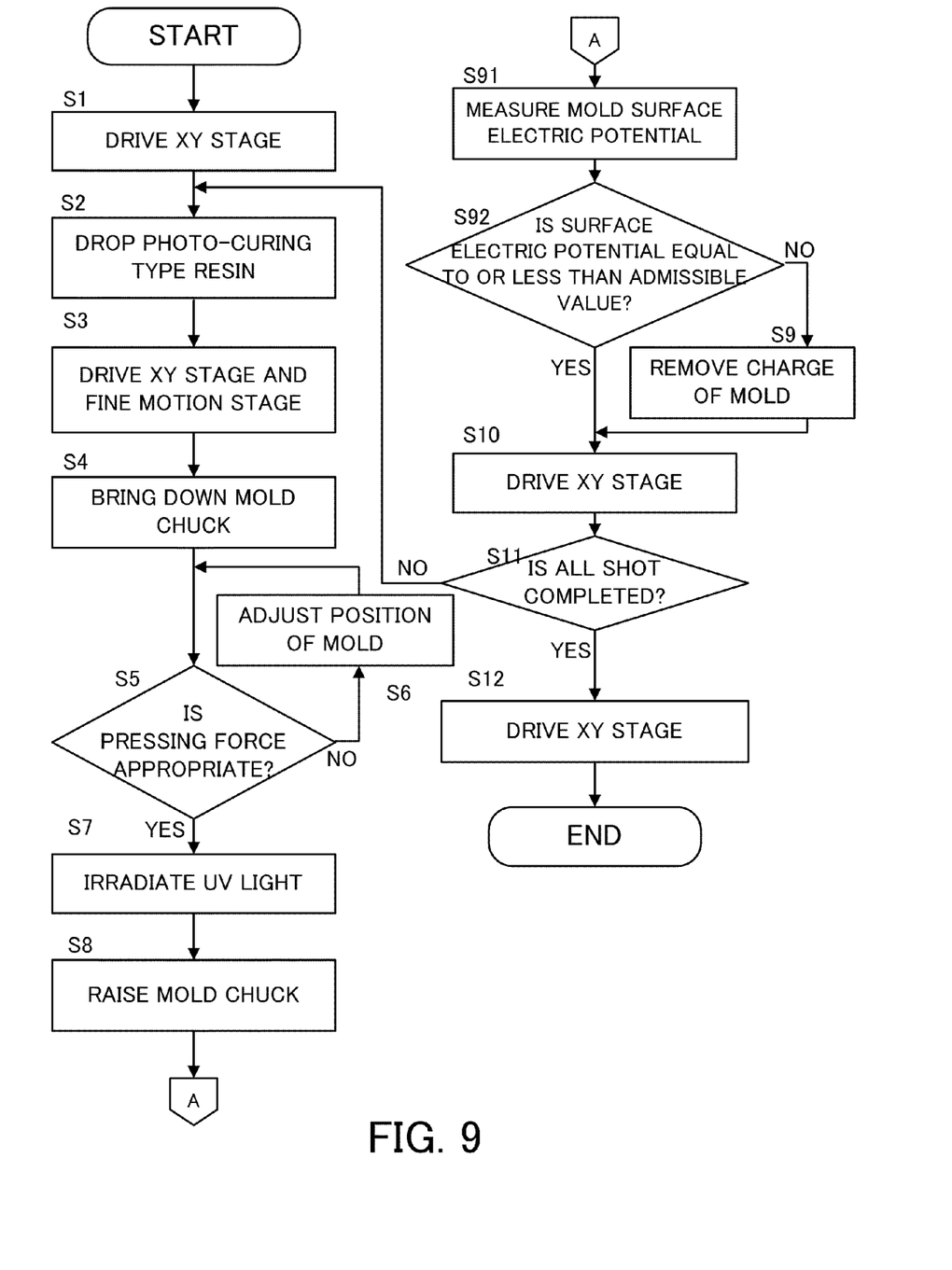
FIG. 9 is a flowchart of a pattern transfer process by a transfer apparatus of embodiment 4.

Next, embodiment 4 of the present invention will be described. FIG. 9 is a flowchart of a pattern transfer process by a transfer apparatus of embodiment 4.

The pattern transfer process shown in FIG. 9 includes a step (Step S91) of measuring the mold surface electric potential by a surface electric potential sensor 70 as in the case of the pattern transfer process of FIG. 7. However, the pattern transfer process of the present embodiment is different from that of FIG. 7 in that whether or not the surface electric potential of the mold 10 is equal to or less than a predetermined admissible value is determined (Step S92) after Step S91.

At Step S92, when the surface electric potential of the mold 10 is equal to or less than the predetermined admissible value, the flow proceeds to "yes", and the XY stage is driven at a resin dropping position for the next shot (Step S10). On the other hand, when the surface electric potential of the mold 10 is more than the predetermined value, the flow proceeds to "no" to remove the charge of the mold by the method described in embodiment 1 or 2 (Step S9).

Thus, in the present embodiment, whether or not the removal of the charge is performed is determined in accordance with the charge amount of the mold (the surface electric potential). In other words, only if the charge amount where it is considered that dusts highly likely adhere to the mold is measured, the charge removal of the mold is performed. Such a configuration can suppress the reduction of the throughput.

Figure 10:
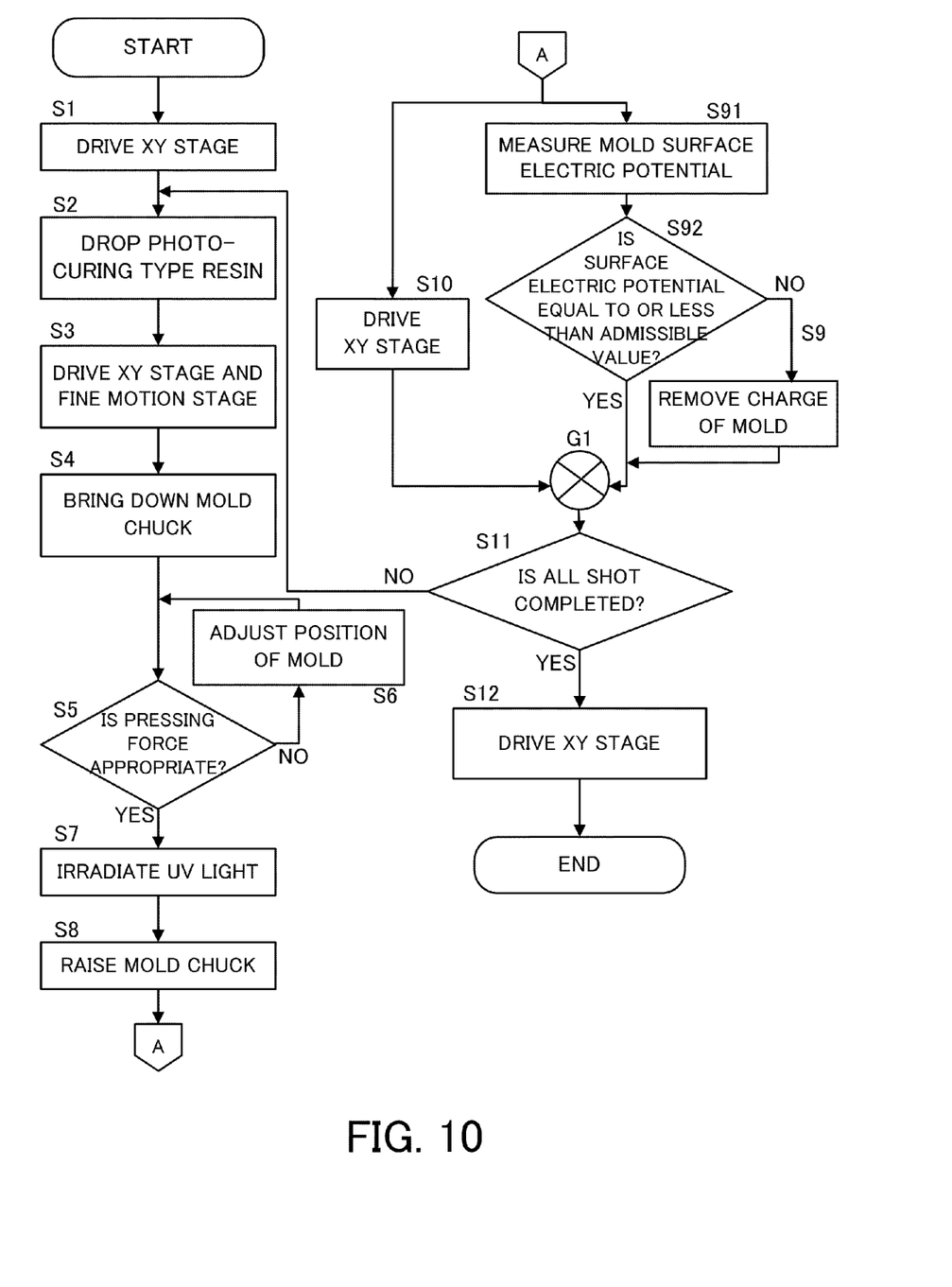
FIG. 10 is a flowchart of a pattern transfer process that in another example in embodiment 4.

FIG. 10 is a flowchart of a pattern transfer process that is another example of the present embodiment. The pattern transfer process of FIG. 10 is different from that of FIG. 9 in that each of the processes from the measurement of the mold surface electric potential to the charge removal of the mold is performed in parallel to the XY stage drive to a resin dropping position for the next shot. In other words, Steps S91, S92, and S9 are performed in parallel to Step S10. When completing all these steps, the flow proceeds to Step S11 via Gate G1. The charge removal of the mold (Step S9) is performed by the same method as that of embodiment 2.

Thus, according to the example, the charge removal is performed only if the charge amount where it is considered that dusts have highly likely adhered is measured, and in addition, the charge removing process is performed in parallel to the drive of the XY stage. Therefore, regardless of performing the charge removal of the mold, the pattern transfer process can be performed without reducing the throughput.

Embodiment 5

Figure 11:
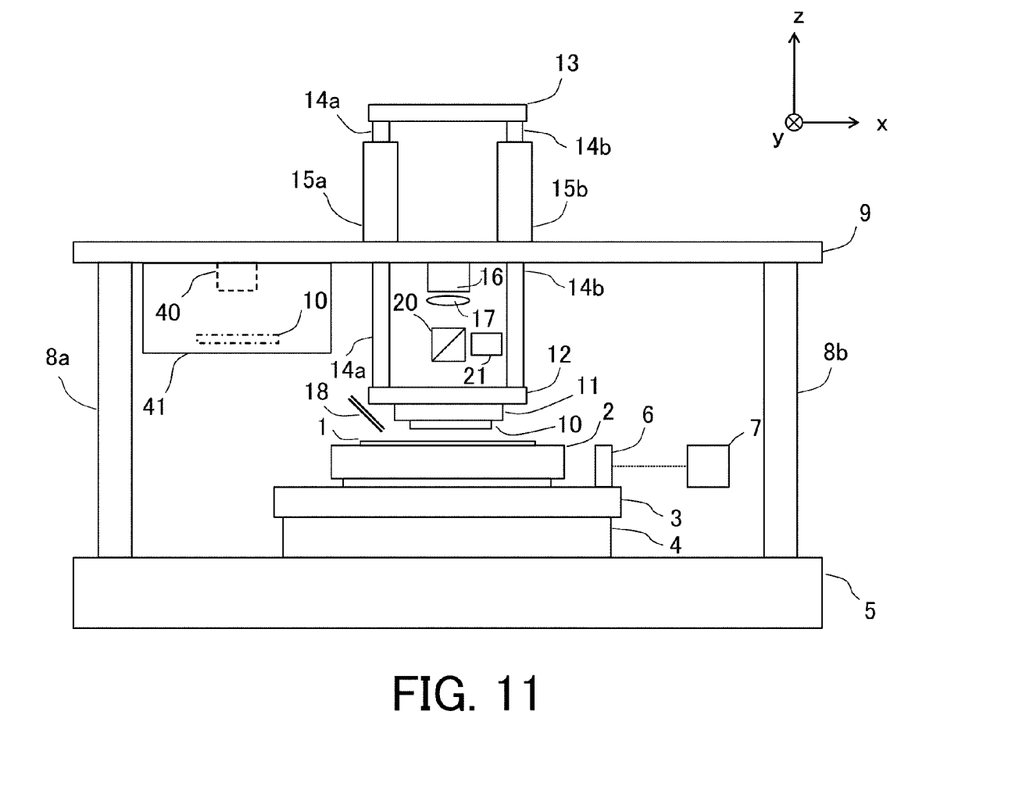
FIG. 11 is a configuration diagram of a transfer apparatus in embodiment 5.

Next, embodiment 5 of the present invention will be described. FIG. 11 is a configuration diagram of a transfer apparatus in the present embodiment.

The transfer apparatus of FIG. 11 is different from that of FIG. 1 in that the nozzles 30 and 31 (charge removing device) of the ionizer on the fine motion stage 3 are not provided. The transfer apparatus of FIG. 11 includes a charge removing device which is fixed to be provided on the top plate 9 instead of the nozzles 30 and 31 of the ionizer.

In FIG. 11, reference numeral 40 denotes a photoionizer as a charge removing device. The photoionizer 40 is integrated with a charge removing station 41 (a charge removing region) that is a shielded space and is fixed on the top plate 9. The photoionizer 40 irradiates a soft X-ray for the mold 10 or the wafer 1 which is placed inside the charge removing station 41. FIG. 11 is the same as FIG. 1 except for the above, and the elements having the same function as that of FIG. 1 will be denoted by the same reference numerals and the descriptions will be omitted.

In FIG. 11, when the mold 10 is replaced, it is transferred to the charge removing station 41 by a conveying device (not shown) before it is placed on the mold chuck 11. The soft X-ray is irradiated on the mold 10 which has been transferred to the charge removing station 41 by the photoionizer 40 to remove the charge. Thus, because the situation where the mold 10 newly placed on the mold chuck 11 is already in a charged state is avoided, the dust adhesion to the mold 10 can be prevented before performing the transfer process.

Similarly, when the wafer 1 is replaced, it is transferred to the charge removing station 41 by a conveying device (not shown) before it is placed on the wafer chuck 2. Removing the charge by the photoionizer 40 inside the charge removing station 41 can prevent the dusts from adhering to the wafer 1 before performing the transfer process. In this case, with regard to the mold, as shown in FIGS. 2A and 2B, the charge removal may be performed using the charge removing device of embodiment 1 by driving the XY stage 4 after it is placed on the mold chuck 11.

Thus, the transfer apparatus of the present embodiment includes a photoionizer 40 which performs the charge removal of the mold or the wafer at the time of transfer for replacing the mold or the wafer. Furthermore, the photoionizer 40 removes the charge at the charge removing station 41 which is provided in a conveying path of the mold or the wafer. Therefore, according to the present embodiment, the transfer process of the pattern can be performed while suppressing the reduction of the throughput.

A device (a semiconductor device, a liquid crystal display device, or the like) is manufactured by performing a process of transferring a pattern onto a substrate (a wafer, a glass plate, or the like) using a transfer apparatus in any one of the above embodiments, a process of etching the substrate, and other well-known processes.

As described above, according to each of the above embodiments, a transfer apparatus which does not generate a transfer failure caused by the dust adhesion to the mold at the time of transferring the pattern or a pattern destruction of the mold to improve the throughput can be provided. A method of manufacturing a device using such a transfer apparatus can also be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Each of the above embodiments is applied to a transfer apparatus of a photo-curing type nanoimprint, but the present invention is not limited to this. For example, the present invention can also be applied to a heat-curing type nanoimprint, and the same effect as that of each of the above embodiment can be obtained.

What is claimed is:

1. A transfer apparatus for molding a material on a substrate using a mold and releasing the mold from a molded material to transfer a pattern to the substrate, the apparatus comprising:
   a chuck configured to hold the mold;
   a stage configured to hold the substrate and to be moved; and
   a charge removing device arranged on the stage and configured to remove a charge of the held mold,
   wherein the apparatus is programmed to cause movement of the stage to be performed such that the charge removing device on the stage moves along the held mold, and cause the charge removing device to remove the charge of the held mold while the movement of the stage is performed.

2. The transfer apparatus according to claim 1, further comprising a dropping nozzle configured to drop the material on one of a plurality of shots on the substrate,
   wherein the apparatus is programmed such that the charge removing device removes the charge of the held mold while the stage is moved to move one of the plurality of shots to a position under the dropping nozzle.

3. The transfer apparatus according to claim 1, wherein the charge removing device includes a nozzle configured to blow an ionized gas, and a nozzle configured to recover the blown ionized gas.

4. The transfer apparatus according to claim 1, wherein the apparatus is programmed to cause the movement of the stage to be performed such that the charge removing device on the stage moves along a pattern surface of the held mold.

5. A method of manufacturing a device, the method comprising:
   transferring a pattern to a substrate using a transfer apparatus; and
   processing the substrate to which the pattern has been transferred to manufacture the device,
   wherein the transfer apparatus molds a material on a substrate using a mold and releases the mold from a molded material to transfer a pattern to the substrate, the apparatus including:
   a chuck configured to hold the mold;
   a stage configured to hold the substrate and to be moved; and a charge removing device arranged on the stage and configured to remove a charge of the held mold, wherein the apparatus is programmed to cause movement of the stage to be performed such that the charge removing device on the stage moves along the held mold, and cause the charge removing device to remove the charge of the held mold while the movement of the stage is performed.

* * * * *